United States Patent
Park et al.

(10) Patent No.: US 6,914,488 B2
(45) Date of Patent: Jul. 5, 2005

(54) BROADBAND AMPLIFICATION APPARATUS FOR BANDWIDTH EXPANSION

(75) Inventors: Sang-Hyun Park, Daejeon (KR); Dong Yun Jung, Anseong-si (KR); Chul Soon Park, Daejeon (KR)

(73) Assignee: Information and Communications University Educational Foundation (KR)

( * ) Notice: Subject to any disclaimer, the term of this patent is extended or adjusted under 35 U.S.C. 154(b) by 0 days.

(21) Appl. No.: 10/613,362

(22) Filed: Jul. 3, 2003

(65) Prior Publication Data

US 2004/0004519 A1 Jan. 8, 2004

(30) Foreign Application Priority Data

Jul. 5, 2002 (KR) ........................................ 2002-38866

(51) Int. Cl.[7] ................................................ H03F 3/68
(52) U.S. Cl. ........................ 330/310; 330/98; 330/283; 330/311
(58) Field of Search .................................. 330/283, 290, 330/296, 310, 311, 98

(56) References Cited

U.S. PATENT DOCUMENTS 4,599,577 A * 7/1986 Nollet ........................ 330/290
6,265,944 B1 * 7/2001 Conta et al. ................ 330/302

* cited by examiner

Primary Examiner—Steven J. Mottola
(74) Attorney, Agent, or Firm—Anderson Kill & Olick, P.C.

(57) ABSTRACT

A broadband amplification apparatus for extending a bandwidth includes a first and a second amplifying unit for amplifying an input signal, a buffering unit and a first inductive buffer. The buffering unit disposed between the first and the second amplifying unit buffers an output signal of the first amplifying unit to thereby maintain a bandwidth of the output signal, increases a gain and returns back a portion of the buffered signal to the first amplifying unit. The first inductive buffer, which is connected to the buffer unit, enhances input impedance as a frequency increases within a predetermined range, thereby introducing little gain changes while serving to extend a bandwidth.

7 Claims, 3 Drawing Sheets

BROADBAND AMPLIFICATION APPARATUS FOR BANDWIDTH EXPANSION

FIELD OF THE INVENTION

The present invention relates to a broadband amplification apparatus; and, more particularly, to a broadband amplification apparatus for extending a bandwidth by using an inductive buffer.

BACKGROUND OF THE INVENTION

Recently, ultrahigh-speed data communications techniques, e.g., an optical communications technique using an optical fiber, have grown rapidly, but demand for transmission of an ever growing amount of data keeps getting stronger, too. To transmit a larger amount of data, it is necessary to implement a broadband amplifier operating at a wider bandwidth. For this purpose, an active element capable of stably operating in an ultrahigh frequency band has to be developed. Since, however, the development of such a new active element will take long time and will cost high, it is important how to install a newly developed element and others in a broadband amplifier circuit, i.e., to improve the way to design a broadband amplifier circuit in order to make the newly developed elements function effectively.

Conventionally, a shunt inductor scheme has been used for designing a broadband amplifier circuit.

FIG. 1 shows a schematic circuit diagram of a prior art broadband amplifier 100 employing the shunt inductor scheme, which includes four transistors TR101 to TR104, a plurality of resistors and an inductor L100. The three transistors TR101 to TR103 respectively form a first amplifying stage, a buffer stage and a second amplifying stage. The transistor TR104, which is designed for biasing the buffer stage TR102, can be replaced with a resistor having an appropriate resistance. Also, each of the resistors has an appropriate resistance for the purpose of bias design. The inductor L100 is connected to a collector of TR101, thereby serving to extend a bandwidth of the broadband amplifier 100.

In accordance with the aforementioned shunt inductor scheme, resonance is induced between the inductor L100 and a parasitic capacitor of a pad (not shown). As the band frequency increases, the resonance enhances impedance at a load of the prior art broadband amplifier 100, thereby increasing a gain in a high frequency band and finally expanding a bandwidth.

However, the shunt inductor scheme accompanies a significant gain peaking, which may degrade the performance of an amplifier, with the gain enhancement and the bandwidth expansion. Such gain characteristic is described with reference to FIG. 2.

FIG. 2 depicts gain characteristic graphs of a conventional amplifier and the prior art broadband amplifier 100 employing the shunt induction scheme, wherein a graph Ga presents a gain characteristic of the conventional amplifier and a graph Gb is of the prior art broadband amplifier 100. The x-axis represents a frequency (Hz) and the y-axis represents a trans-impedance gain (dBΩ).

At a trans-impedance of around 50 dBΩ, the prior art broadband amplifier 100 has a larger available bandwidth of 10.5 GHz compared to the conventional amplifier having a bandwidth of 8.4 GHz. This, however, comes at the cost of a significant gain peaking over 2 dBΩ, as can be seen from the graphs. Such significant gain changes within an available bandwidth where data is processed may exceed a maximum allowable input voltage of a limiting amplifier to be coupled thereafter, which may cause an operational error.

Therefore, it is required a bandwidth expansion scheme for obtaining a sufficient bandwidth expansion with little gain changes.

SUMMARY OF THE INVENTION

It is, therefore, an object of the present invention to provide an amplification apparatus capable of extending a bandwidth with little gain changes.

In accordance with the present invention, there is provided a broadband amplification apparatus for extending a bandwidth including: a first and a second amplifying unit for amplifying an input signal; a buffering unit, which is disposed between the first and the second amplifying unit, for buffering an output signal of the first amplifying unit to thereby maintain a bandwidth of the output signal, increasing a gain and returning back a portion of the buffered signal to the first amplifying unit; and a first inductive buffer, which is connected to the buffering unit, for enhancing an input impedance as a frequency increases within a predetermined range, thereby introducing little gain changes while serving to extend a bandwidth.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENTS

Figure 3:
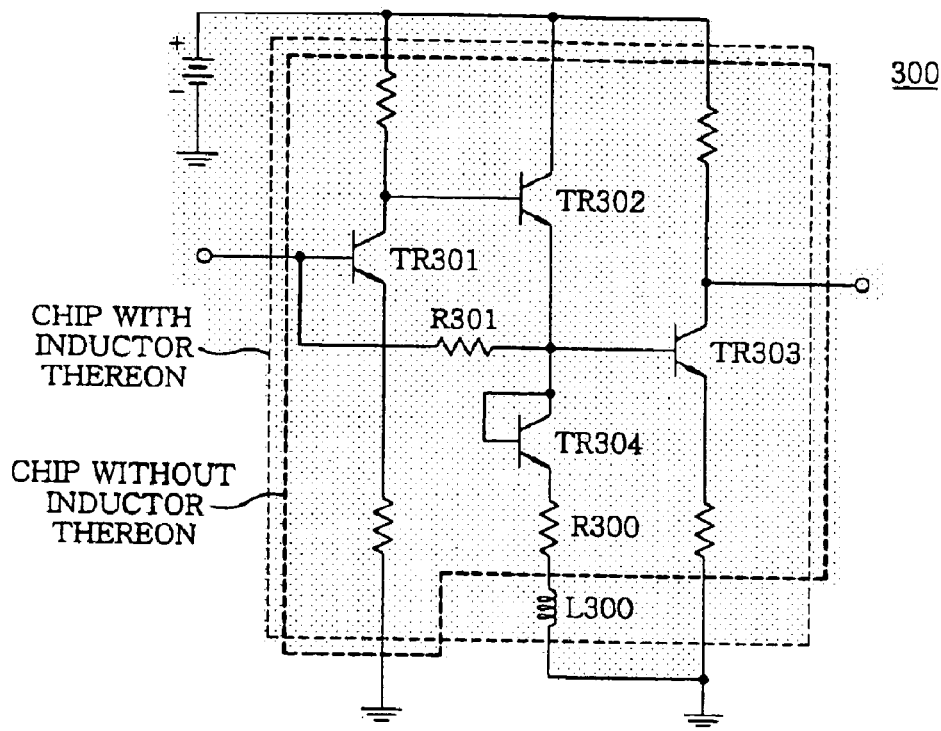
FIG. 3 presents a schematic circuit diagram of a broadband amplifier in accordance with a preferred embodiment of the present invention.

FIG. 3 presents a schematic circuit diagram of a broadband amplifier 300 employing an inductive buffer scheme in accordance with a preferred embodiment of the present invention, which includes four transistors TR301 to TR304, a multiplicity of resistors and an inductor L300.

The transistor TR301 is formed in a structure of a common emitter as a first amplifying stage for amplifying an input signal. In case where the first amplifying stage TR301 cannot provide sufficient gain, other amplifying stage, e.g., a second amplifying stage TR303, may be additionally connected thereto.

The transistor TR302 is installed between the first and the second amplifying stage TR301 and TR303. In this case, the transistor TR302 functions as a buffer stage for buffering an input signal thereto. That is, it maintains a bandwidth of an output signal from a front stage, i.e., the first amplifying stage TR301 while increasing a gain within a corresponding bandwidth. Further, the buffer stage TR302 allows a portion of the buffered signal to return back to an input terminal of the first amplifying stage TR301 via a resistor R301 and transfers the other portion of the buffered signal to the second amplifying stage TR303.

The transistor TR304 is connected to the buffer stage TR302 and acts as a bias stage for biasing the buffer stage TR302. The bias stage TR304 may be replaced with a resistor having an appropriate resistance.

The multiplicity of resistors is also used for a bias design and each of the resistors has an appropriate resistance.

Meanwhile, the inductor L300 is coupled to the buffer stage TR302 via the bias stage TR304 and a resistor R300. The inductor L300 functions as an inductive buffer, thereby serving to extend a bandwidth of the broadband amplifier 300.

The inductor L300 functioning as an inductive buffer provides a prominent gain enhancement and an effective bandwidth expansion for the broadband amplifier 300. For this purpose, an optimal inductance of the inductor may be decided by simulating a gain enhancement and a bandwidth expansion varying with the inductance of the inductor. Meanwhile, in general, an inductor occupies a significantly large area on a semiconductor chip and, accordingly, it is preferable to implement the inductor in a small size. Therefore, a trade-off between the gain enhancement and the size of the inductor should be considered in determining the inductance of the inductor.

The inductor L300 functioning as an inductive buffer may be directly formed on a semiconductor chip or a stripline inductor which is connected to a module outside a chip.

In accordance with an inductive buffer scheme of the present invention wherein the inductor L300 serves to extend a bandwidth of the amplifier 300, an input impedance of the broadband amplifier 300 is enhanced as a frequency increases. The impedance enhancement affects an output signal of the first amplifying stage TR301 in a manner that the output signal is applied to the buffer stage TR302 in a greater amount than the others in accordance with Kirchhoff's voltage law. This is more outstanding in a high frequency band, thereby increasing a gain in a high frequency band and finally expanding a bandwidth.

Figure 4:
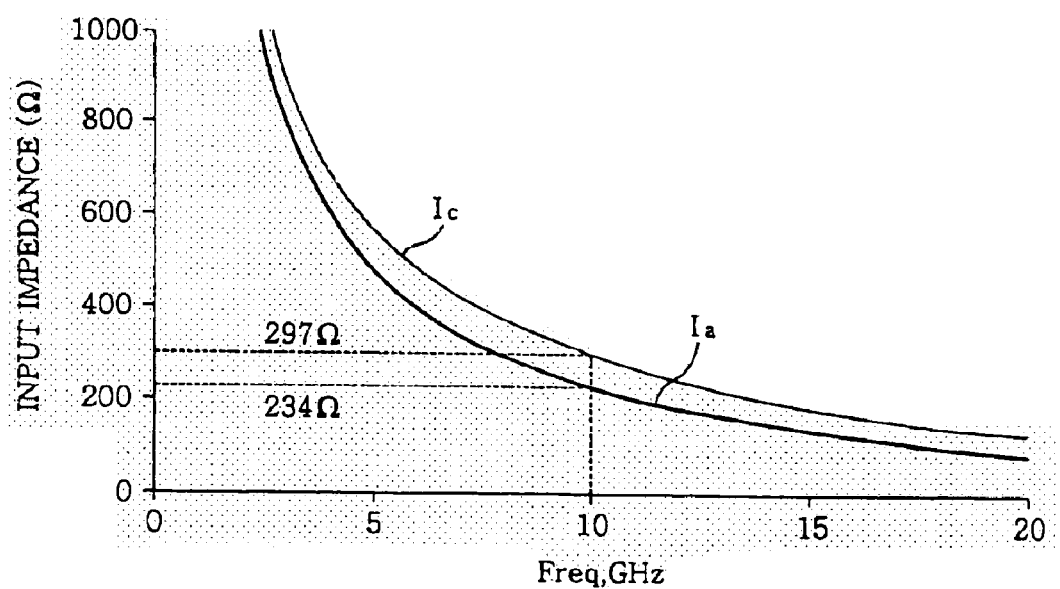
FIG. 4 illustrates input impedances of the conventional amplifier and the inventive broadband amplifier of FIG. 3.

FIG. 4 illustrates simulation results showing the above-mentioned characteristics of the broadband amplifier in accordance with the preferred embodiment of the present invention.

In FIG. 4, a graph Ia shows an input impedance of a conventional amplifier and a graph Ic exhibits that of the broadband amplifier of FIG. 3. The x-axis represents a frequency (GHz) and the y-axis represents an input impedance (Ω). The inductor functioning as an inductive buffer used in this simulation has an inductance of 3 nH.

As can be seen from the simulation results, at a frequency bandwidth of 10 GHz, the input impedance of the inventive broadband amplifier 300 is increased by 63 Ω in comparison to that of the conventional amplifier. Such impedance enhancement improves a gain in a higher frequency band, thereby expanding a bandwidth, as mentioned above.

Figure 1:
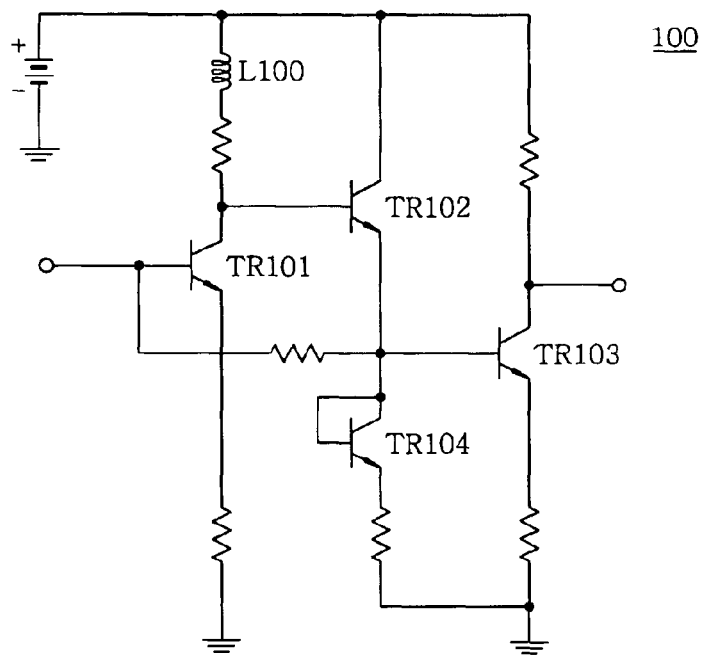
FIG. 1 shows a schematic circuit diagram of a prior art broadband amplifier employing a shunt inductor scheme.
Figure 2:
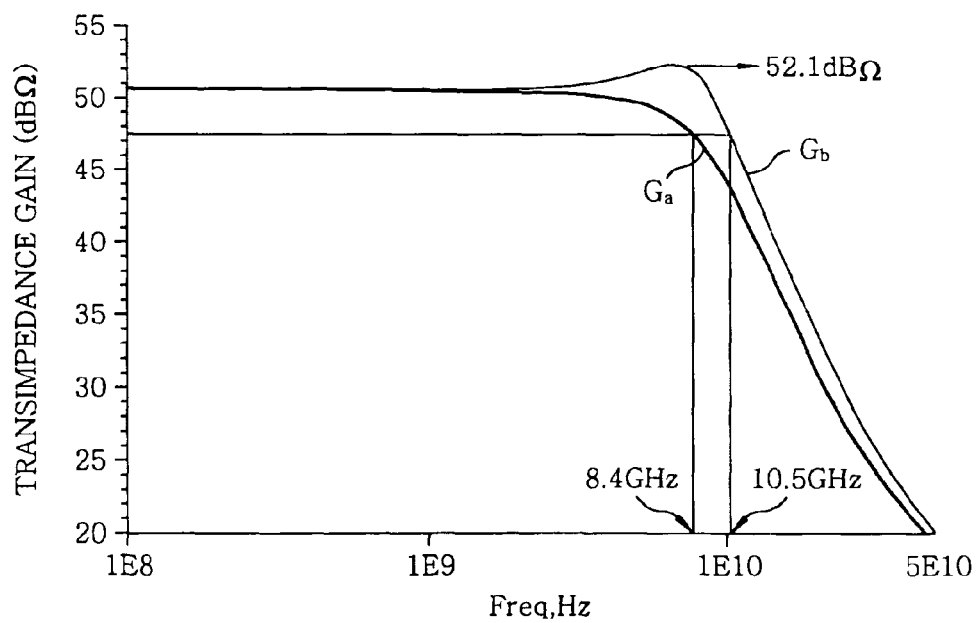
FIG. 2 depicts gin characteristic graphs of a conventional amplifier and the prior art broadband amplifier of FIG. 1.
Figure 5:
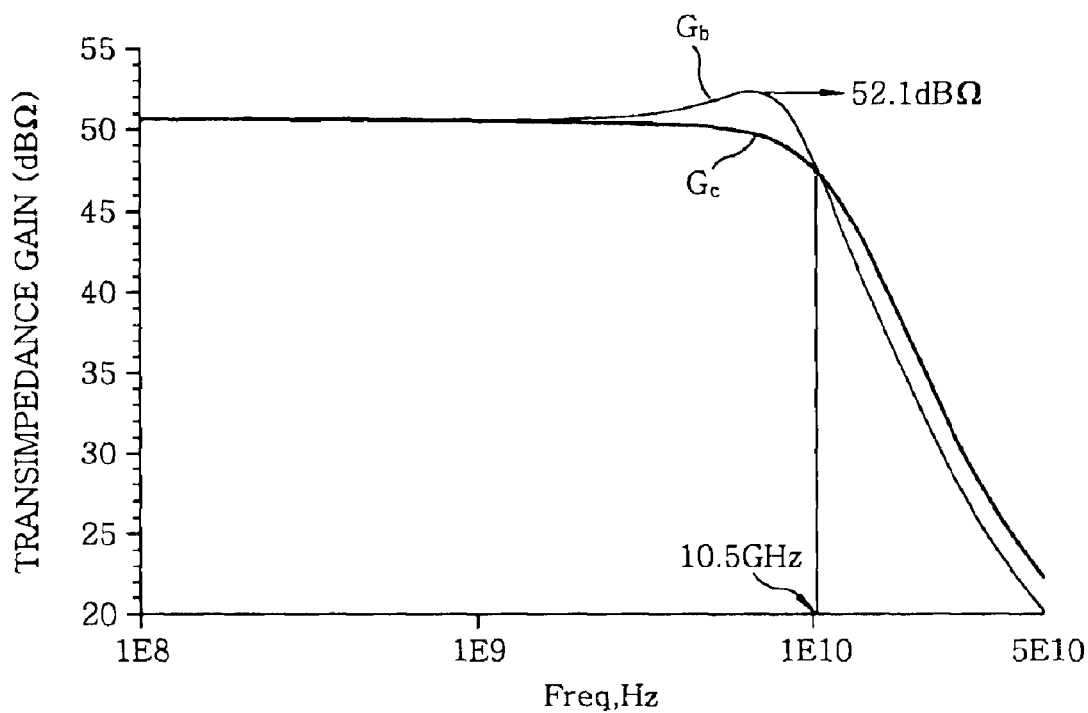
FIG. 5 is characteristic graphs for illustrating trans-impedance of the prior art broadband amplifier of FIG. 1 and the inventive broadband amplifier of FIG. 3.

Furthermore, the broadband amplifier 300 employing the inventive inductive buffer scheme has little gain changes. FIG. 5 offers gain characteristic graphs of the prior art broadband amplifier 100 of FIG. 1 and the broadband amplifier 300 of FIG. 3, wherein a graph Gb is a gain characteristic graph of the prior art broadband amplifier 100 and a graph Gc is that of the broadband amplifier 300. The x-axis represents a frequency (Hz) and the y-axis represents a trans-impedance gain (dBΩ).

At a trans-impedance gain of about 50 dBΩ, the prior art broadband amplifier 100 generates an overshoot of 2.1 dBΩ within a bandwidth of 10.5 GHz. However, the broadband amplifier 300 exhibits a relatively constant gain within the identical bandwidth of 10.5 GHz. That is, the broadband amplifier 300 employing the inventive inductive buffer scheme introduces little gain changes while expanding a bandwidth.

As long as the inductor L300 of the present invention is provided in the bias stage TR304, the presence of the inductor L100 of the prior art amplifier 100 may be insignificant, that is, the inductor L100 may be embodied in the first amplifying stage TR301 without substantially affecting the intended behavior of the broadband amplifier 300 of the present invention.

Further, the present invention may be effectively applied into not only a transceiver of the ultrahigh-speed optical communications system but also various ultrahigh frequency circuits, i.e., an amplifier of a transceiver used in communications services such as a wireless LAN (Local Area Network), broadband wireless communications, etc.

While the invention has been shown and described with respect to the preferred embodiments, it will be understood by those skilled in the art that various changes and modifications may be made without departing from the spirit and scope of the invention as defined in the following claims.

What is claimed is:

1. A broadband amplification apparatus for extending a bandwidth, comprising:

a first and a second amplifying unit for amplifying an input signal;

a buffering unit, which is disposed between the first and the second amplifying unit, for buffering an output signal of the first amplifying unit to thereby maintain a bandwidth of the output signal, increasing a gain and returning back a portion of the buffered signal to the first amplifying unit; and a first inductive buffer, which is connected to a bias terminal of the buffering unit, for enhancing an input impedance as a frequency increases within a predetermined range, thereby introducing little gain changes while serving to extend a bandwidth.

2. The apparatus of claim 1, wherein the first inductive buffer is an inductor.

3. The apparatus of claim 2, wherein the first inductive buffer is an inductor directly formed on a semiconductor chip.

4. The apparatus of claim 2, wherein the first inductive buffer is a strip-line inductor connected to a module outside a semiconductor.

5. The apparatus of claim 1, further comprising a bias unit, which is connected between the buffering unit and the first inductive buffer, for a bias design.

6. The apparatus of claim 5, wherein the bias unit is formed of a transistor.

7. The apparatus of claim 5, wherein the bias unit is formed of a resistor.

* * * * *